United States Patent
Cho

(10) Patent No.: US 12,094,706 B2
(45) Date of Patent: Sep. 17, 2024

(54) SUBSTRATE TREATING APPARATUS AND SUBSTRATE TREATING METHOD

(71) Applicant: SEMES CO., LTD., Chungcheongnam-do (KR)

(72) Inventor: Myung Chan Cho, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/901,904

(22) Filed: Sep. 2, 2022

(65) Prior Publication Data
US 2023/0071737 A1     Mar. 9, 2023

(30) Foreign Application Priority Data

Sep. 3, 2021   (KR) .......................... 10-2021-0117641

(51) Int. Cl.
*H01L 21/02*     (2006.01)
*H01L 21/67*     (2006.01)

(52) U.S. Cl.
CPC .. *H01L 21/02101* (2013.01); *H01L 21/67023* (2013.01); *H01L 21/67109* (2013.01); *H01L 21/67248* (2013.01)

(58) Field of Classification Search
CPC ..................... H01L 21/02101; H01L 21/00–86
See application file for complete search history.

(56) References Cited

U.S. PATENT DOCUMENTS

| | | | |
|---|---|---|---|
| 11,600,488 | B2 | 3/2023 | Ohashi |
| 2019/0393028 | A1 | 12/2019 | Kaneko et al. |
| 2022/0208566 | A1* | 6/2022 | Goshi ............... H01L 21/02101 |

FOREIGN PATENT DOCUMENTS

| | | |
|---|---|---|
| CN | 112216631 A | 1/2021 |
| JP | 2007-175559 A | 7/2007 |
| JP | 2010-161165 A | 7/2010 |
| JP | 2011-009299 A | 1/2011 |
| JP | 2020-004757 A | 1/2020 |

(Continued)

OTHER PUBLICATIONS

Office Action issued by the Korean Intellectual Property Office in KR Patent Application No. 10-2021-0117641, dated Jun. 1, 2023, with English Translation.

(Continued)

*Primary Examiner* — Mikhail Kornakov
*Assistant Examiner* — Richard Z. Zhang
(74) *Attorney, Agent, or Firm* — Carter, DeLuca & Farrell LLP

(57) ABSTRACT

Provided is a substrate treating method. The substrate treating method includes: a first supercritical processing operation of loading a first substrate into a supercritical chamber and supercritically processing the first substrate in the supercritical chamber; a resting operation of maintaining the supercritical chamber in an empty state for a first time until a temperature in the supercritical chamber becomes a preset temperature by opening the supercritical chamber after the first substrate is unloaded from the supercritical chamber; and a second supercritical processing operation of loading a second substrate into the supercritical chamber and supercritically processing the second substrate in the supercritical chamber.

6 Claims, 8 Drawing Sheets

(56) References Cited

FOREIGN PATENT DOCUMENTS

| | | | |
|---|---|---|---|
| JP | 6857675 B2 | | 4/2021 |
| JP | 2021086857 A | * | 6/2021 |
| KR | 10-1681190 B1 | | 12/2016 |
| KR | 10-2018-0079548 A | | 7/2018 |
| TW | 2013/08419 A | | 2/2013 |
| TW | 2021/07595 A | | 2/2021 |
| WO | WO2022202528 A1 | * | 9/2022 |

OTHER PUBLICATIONS

Office Action issued by the Taiwan Patent Office in corresponding TW Patent Application No. 111131556, dated Mar. 7, 2023, pp. 1-8.
Notice of Reasons for Refusal issued by the Japanese Patent Office on Oct. 3, 2023 in corresponding JP Patent Application No. 2022-139193, with English translation.

* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0117641 filed in the Korean Intellectual Property Office on Sep. 3, 2021, the entire contents of which are incorporated herein by reference.

TECHNICAL FIELD

The present invention relates to an apparatus and method of treating a substrate, and more particularly, to an apparatus and a method of treating a substrate by using a supercritical fluid.

BACKGROUND ART

In general, a semiconductor device is manufactured from a substrate, such as a wafer. Specifically, the semiconductor device is manufactured by forming a fine circuit pattern on an upper surface of the substrate by performing a deposition process, a photolithography process, an etching process, and the like.

Since various foreign substances are attached to the upper surface of the substrate on which the circuit pattern is formed while performing the above processes, a cleaning process for removing foreign substances on the substrate is performed between the processes.

In general, the cleaning process includes chemical treatment of removing foreign substances on a substrate by supplying a chemical to the substrate, rinsing treatment of removing the chemicals left on the substrate by supplying deionized water to the substrate, and drying treatment of removing the deionized water left on the substrate.

A supercritical fluid is used for the drying treatment of the substrate.

According to one example, after replacing pure water on the substrate with an organic solvent, the supercritical fluid is supplied to the upper surface of the substrate in a high pressure chamber to dissolve the organic solvent remaining on the substrate in the supercritical fluid to remove the organic solvent from the substrate. When isopropyl alcohol (hereinafter, referred to as "IPA") is used as the organic solvent, carbon dioxide ($CO_2$) which has a relatively low critical temperature and critical pressure and in which IPA is well soluble is used as the supercritical fluid.

The treatment of the substrate by using the supercritical fluid is as follow. When the substrate is loaded into the high-pressure chamber, carbon dioxide in a supercritical state is supplied into the high-pressure chamber to pressurize the inside of the high-pressure chamber, and thereafter, the substrate is treated with the supercritical fluid while repeating the supply of the supercritical fluid and the exhaust of the high-pressure chamber. Then, when the treatment of the substrate is completed, the pressure is reduced by exhausting the inside of the high-pressure chamber.

However, when a plurality of preceding substrates is successively treated with a high-temperature and high-pressure supercritical fluid, the temperature of the high-pressure chamber may be overheated, which may adversely affect the supercritical processing of the succeeding substrates.

SUMMARY OF THE INVENTION

The present invention has been made in an effort to provide a substrate treating apparatus and method of preventing overheating of a supercritical chamber when several substrates are continuously treated by using a supercritical fluid.

The present invention has also been made in an effort to provide a substrate treating apparatus and method capable of treating each substrate under the same temperature condition when several substrates are continuously treated by using a supercritical fluid.

The object of the present invention is not limited thereto, and other objects not mentioned will be clearly understood by those of ordinary skill in the art from the following description.

An exemplary embodiment of the present invention provides a substrate treating method, including: a first supercritical processing operation of loading a first substrate into a supercritical chamber and supercritically processing the first substrate in the supercritical chamber; a resting operation of maintaining the supercritical chamber in an empty state for a first time until a temperature in the supercritical chamber becomes a preset temperature by opening the supercritical chamber after the first substrate is unloaded from the supercritical chamber; and a second supercritical processing operation of loading a second substrate into the supercritical chamber and supercritically processing the second substrate in the supercritical chamber.

In the exemplary embodiment, the first time may be set based on an initial set temperature for treating the second substrate in the second supercritical processing operation.

In the exemplary embodiment, the second supercritical processing operation may include: a pressurizing operation of pressurizing the fluid by supplying a fluid of a first temperature into the supercritical chamber; and a treating operation of treating the substrate with the fluid, and the initial set temperature may be provided at a temperature equal to or lower than the first temperature.

In the exemplary embodiment, the substrate treating method may further include a transferring operation of transferring the first substrate liquid-treated in a liquid treating chamber to the supercritical chamber, before the first supercritical processing operation, in which when the transferring operation is delayed from a preset time, a temperature correcting operation of increasing the temperature in the supercritical chamber may be performed.

In the exemplary embodiment, the temperature correcting operation may be performed during a time for the temperature inside the supercritical chamber to be the initial set temperature.

In the exemplary embodiment, the temperature correcting operation may be performed by supplying the fluid of the first temperature to the supercritical chamber.

In the exemplary embodiment, after the temperature correcting operation, the resting operation may be performed.

Another exemplary embodiment of the present invention provides a substrate treating method, including: liquid-treating a substrate in a liquid treating chamber, and then transferring the substrate to a high-pressure supercritical chamber, and supercritically processing the substrate in the supercritical chamber, in which when the transferring is delayed from a preset time, a temperature correcting operation of correcting a temperature inside the supercritical chamber is performed, and the temperature correcting operation is performed for a time for the temperature inside the supercritical chamber to be an initial set temperature for treating the substrate in the supercritical chamber.

In the exemplary embodiment, the temperature correcting operation may be performed by supplying a high-temperature fluid to the supercritical chamber.

In the exemplary embodiment, in the temperature correcting operation, the inside of the supercritical chamber may be cleaned with the high-temperature fluid.

In the exemplary embodiment, the supercritical processing may include: a pressurizing operation of supplying a fluid of a first temperature to the supercritical chamber to pressurize the fluid; and a treating operation of treating the substrate with the fluid, and the initial set temperature may be provided at a temperature equal to or lower than the first temperature.

In the exemplary embodiment, in the temperature correcting operation, the fluid of the first temperature may be supplied into the supercritical chamber.

In the exemplary embodiment, the supercritical processing may include: a first supercritical processing operation of loading a first substrate into a supercritical chamber and supercritically processing the first substrate in the supercritical chamber; a resting operation of maintaining the supercritical chamber in an empty state for a first time until a temperature in the supercritical chamber becomes a preset temperature by opening the supercritical chamber after the first substrate is unloaded from the supercritical chamber; and a second supercritical processing operation of loading a second substrate into the supercritical chamber and supercritically processing the second substrate in the supercritical chamber.

In the exemplary embodiment, after the temperature correcting operation, the resting operation may be performed.

In the exemplary embodiment, the first time may be set based on an initial set temperature for treating the second substrate in the second supercritical processing operation.

Still another exemplary embodiment of the present invention provides a substrate treating apparatus, including: a liquid treating chamber for liquid-treating a substrate inside thereof; a supercritical chamber for supercritically processing the substrate in an internal treatment space; a transfer means for transferring the substrate in the liquid treating chamber to the supercritical chamber; and a controller for controlling the liquid treating chamber, the supercritical chamber, and the transfer means, in which the super critical chamber includes: a support unit for supporting the substrate in the treatment space; a fluid supply unit for supplying a fluid to the treatment space; and a heating means for heating the fluid, and when a time for which the transfer means transfers the substrate from the liquid treating chamber to the supercritical chamber is delayed from a preset time, the controller controls the supercritical chamber so that a temperature correcting operation of increasing an internal temperature of the supercritical chamber to a first temperature by supplying the high-temperature fluid to the treatment space is performed for a preset time.

In the exemplary embodiment, the first temperature may be an initial set temperature for treating the substrate.

In the exemplary embodiment, the controller controls the supercritical chamber so that, after a first substrate is loaded into the supercritical chamber and the first substrate is supercritically processed in the supercritical chamber, the first substrate is unloaded from the supercritical chamber, and then the supercritical chamber is maintained in an empty state for a first time until a temperature in the supercritical chamber becomes a preset temperature by opening the supercritical chamber, and then a second substrate is loaded into the supercritical chamber and is supercritically processed in the supercritical chamber.

In the exemplary embodiment, the first time may be set based on an initial set temperature for treating the second substrate in the second supercritical processing operation.

In the exemplary embodiment, the heating means is provided outside the housing.

According to the exemplary embodiment of the present invention, it is possible to prevent overheating of the supercritical chamber when several substrates are continuously treated by using the supercritical fluid.

According to the exemplary embodiment of the present invention, when several substrates are continuously treated by using a supercritical fluid, it is possible to treat each substrate under the same temperature condition.

The effect of the present invention is not limited to the foregoing effects, and those skilled in the art may clearly understand non-mentioned effects from the present specification and the accompanying drawings.

DETAILED DESCRIPTION

Figure 1:
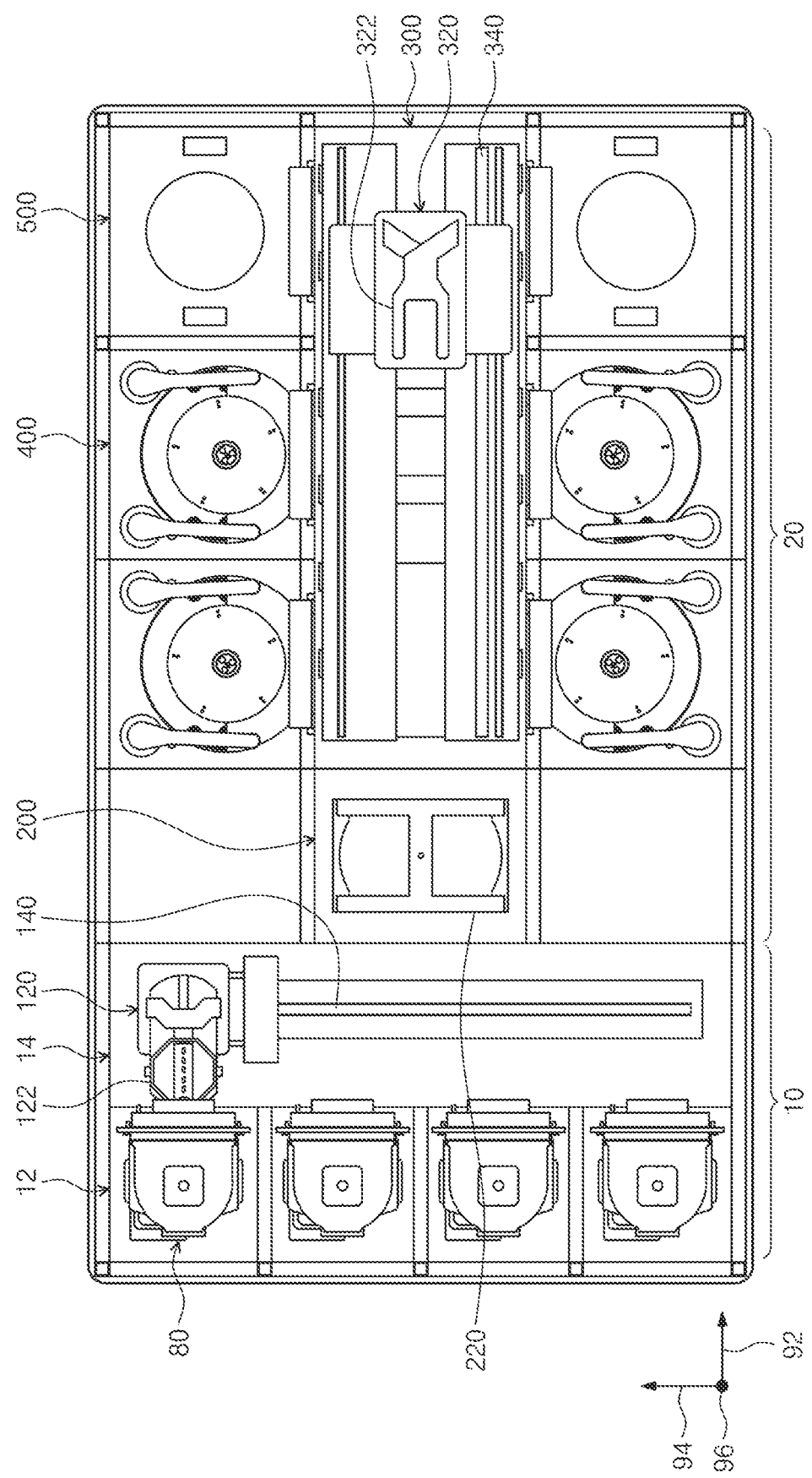
FIG. 1 is a top plan view schematically illustrating a substrate treating apparatus according to an exemplary embodiment of the present invention.

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Therefore, the shapes of elements in the drawings are exaggerated to emphasize a clearer description.

FIG. 1 is a top plan view schematically illustrating a substrate treating apparatus according to an exemplary embodiment of the present invention. Referring to FIG. 1, the substrate treating apparatus includes an index module 10, a treating module 20, and a controller (not illustrated). According to the exemplary embodiment, the index module 10 and the treating module 20 are disposed in one direction. Hereinafter, the direction in which the index module 10 and the treating module 20 are disposed is referred to as a first direction 92, and when viewed from above, a direction vertical to the first direction 92 is referred to as a second direction 94, and a direction vertical to both the first direction 92 and the second direction 94 is referred to as a third direction 96.

The index module 10 transfers a substrate W from a container 80 in which the substrate W is accommodated to the treating module 20, and makes the substrate W, which has been completely treated in the treating module 20, be accommodated in the container 80. A longitudinal direction of the index module 10 is provided in the second direction 94. The index module 10 includes a load port 12 and an index frame 14. Based on the index frame 14, the load port 12 is located at a side opposite to the treating module 20. The container 80 in which the substrates W are accommodated is placed on the load port 12. The load port 12 may be provided in plurality, and the plurality of load ports 12 may be disposed in the second direction 94.

As the container 80, an airtight container, such as a Front Open Unified Pod (FOUP), may be used. The container 80 may be placed on the load port 12 by a transport means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The index robot 120 includes a hand 122 on which the substrate W is placed, and the hand 122 may be provided to be movable forward and backward, rotatable based on the third direction 96 as an axis, and movable in the third direction 96. The plurality of hands 122 is provided while being spaced apart from each other in the vertical direction, and is capable of independently moving forward and backward.

The treating module 20 includes a buffer unit 200, a transfer means 300, a liquid treating device 400, and a supercritical device 500. The buffer unit 200 provides a space in which the substrate W loaded to the treating module 20 and the substrate W unloaded from the treating module 20 stay temporarily. The liquid treating device 400 performs a liquid treating process of liquid-treating the substrate W by supplying a liquid onto the substrate W. The supercritical device 500 performs a drying process of removing the liquid left on the substrate W. The transfer device 300 transfers the substrate W between the buffer unit 200, the liquid treating device 400, and the supercritical device 500.

A longitudinal direction of the transfer means 300 may be provided in the first direction 92. The buffer unit 200 may be disposed between the index module 10 and the transfer means 300. The liquid treating device 400 and the supercritical device 500 may be disposed on the side of the transfer means 300. The liquid treating device 400 and the transfer means 300 may be disposed along the second direction 94. The supercritical device 500 and the transfer means 300 may be disposed along the second direction 94. The buffer unit 200 may be located at one end of the transfer means 300.

According to an example, the liquid treating devices 400 are disposed on both sides of the transfer means 300, the supercritical devices 500 are disposed on both sides of the transfer means 300, and the liquid treating devices 400 may be disposed closer to the buffer unit 200 than the supercritical devices 500. At one side of the transfer means 300, the liquid treating devices 400 may be provided in an arrangement of A×B (each of A and B is 1 or a natural number larger than 1) in the first direction 92 and the third direction 96. Further, at one side of the transfer means 300, the supercritical devices 500 may be provided in number of C×D (each of C and D is 1 or a natural number larger than 1) in the first direction 92 and the third direction 96. Unlike the above, only the liquid treating devices 400 may be provided on one side of the transfer means 300, and only the supercritical devices 500 may be provided on the other side of the transfer means 300.

The transfer means 300 has the transfer robot 320. A guide rail 340 having a longitudinal direction in the first direction 92 is provided in the transfer means 300, and the conveying robot 320 may be provided to be movable on the guide rail 340. The transfer robot 320 includes a hand 322 on which the substrate W is placed, and the hand 322 may be provided to be movable forward and backward, rotatable based on the third direction 96 as an axis, and movable in the third direction 96. A plurality of hands 322 are provided while being vertically spaced apart from each other, and the hands 322 may move forward and backward independently of each other.

The buffer unit 200 includes a plurality of buffers 220 on which the substrate W is placed. The buffers 220 may be disposed while being spaced apart from each other in the third direction 96. A front face and a rear face of the buffer unit 200 are opened. The front side is a side facing the index module 10, and the rear side is a side facing the transfer means 300. The index robot 120 may approach the buffer unit 200 through the front face, and the transfer robot 320 may approach the buffer unit 200 through the rear face.

Figure 2:
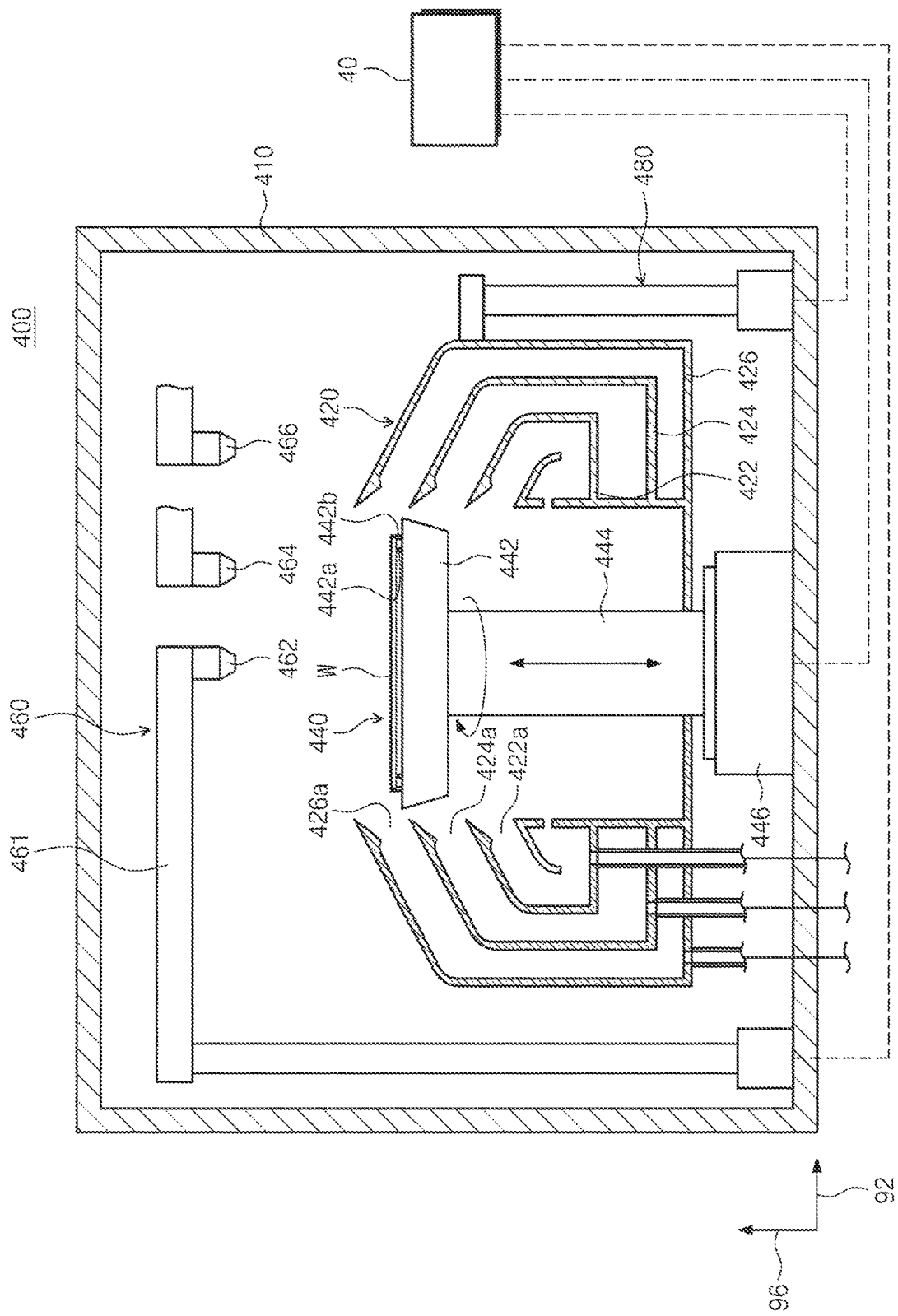
FIG. 2 is a diagram schematically illustrating an exemplary embodiment of a liquid treating chamber of FIG. 1.

FIG. 2 is a diagram schematically illustrating an exemplary embodiment of the liquid treating device 400 of FIG. 1. Referring to FIG. 2, the liquid treating device 400 includes a liquid treating chamber 410, a cup 420, a support unit 440, a liquid supply unit 460, a lifting unit 480, and a controller 40. The controller 40 controls the operations of the liquid supply unit 460, the support unit 440, and the lifting unit 480. The liquid treating chamber 410 is provided in a substantially rectangular parallelepiped shape. The cup 420, the support unit 440, and the liquid supply unit 460 are disposed in the liquid treating chamber 410.

The cup 420 has a treatment space having an open top, and the substrate W is liquid-treated within the treatment space. The support unit 440 supports the substrate W within the treatment space. The liquid supply unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to one example, the cup 420 includes a plurality of recovery containers 422, 424, and 426. Each of the recovery containers 422, 424, and 426 has a recovery space of recovering the liquid used for the treatment of the substrate. Each of the recovery containers 422, 424, and 426 is provided in a ring shape surrounding the support unit 440. The pre-treatment liquid scattered by the rotation of the substrate W when the liquid treating process progresses is introduced into the recovery space through inlets 422a, 424a, and 426a of the recovery containers 422, 424, and 426, respectively. According to one example, the cup 420 includes the first recovery container 422, the second recovery container 424, and the third recovery container 426. The first recovery container 422 is disposed to surround the support unit 440, the second recovery container 424 is disposed to surround the first recovery container 422, and the third recovery container 426 is disposed to surround the second recovery container 424. The second inlet 424a through which the liquid is introduced to the second recovery container 424 may be positioned above the first inlet 422a through which the liquid is introduced to the first recovery container 422, and the third inlet 426a through which the liquid is introduced to the third recovery container 426 may be positioned above the second inlet 424a.

The support unit 440 includes a support plate 442 and a driving shaft 444. An upper surface of the support plate 442 may be provided in a generally circular shape, and may have a diameter larger than a diameter of the substrate W. A support pin 442a supporting the rear surface of the substrate W is provided to a center portion of the support plate 442, and an upper end of the support pin 442a is provided to protrude from the support plate 442 so that the substrate W is spaced apart from the support plate 442 by a predetermined distance. A chuck pin 442b is provided to an edge of the support plate 442.

The chuck pin 442b is provided to protrude upward from the support plate 442, and supports the lateral portion of the substrate W so that the substrate W is not separated from the support unit 440 when the substrate W is rotated. The driving shaft 444 is driven by the driver 446, is connected to the center of the bottom surface of the substrate W, and rotates the support plate 442 based on the central axis thereof.

According to one example, the liquid supplying unit 460 includes a first nozzle 462, a second nozzle 464, and a third nozzle 446. The first nozzle 462 supplies a first liquid onto the substrate W. The first liquid may be the liquid of removing a film or foreign substances left on the substrate W. The second nozzle 464 supplies a second liquid onto the substrate W. The second liquid may be the liquid well soluble in a third liquid. For example, the second liquid may be the liquid that is better soluble in the third liquid than the first liquid. The second liquid may be the liquid that neutralizes the first liquid supplied onto the substrate W. Further, the second liquid may be the liquid that neutralizes the first solution and at the same time is better soluble in the third solution than the first solution.

According to one example, the second liquid may be water. The third nozzle 466 supplies the third liquid onto the substrate W. The third liquid may be the liquid well soluble in a supercritical fluid used in the supercritical device 500. For example, the third liquid may be the liquid that is better soluble in the supercritical fluid used in the supercritical device 500 than the second liquid. According to an example, the third liquid may be an organic solvent. The organic solvent may be isopropyl alcohol (IPA). For example, the supercritical fluid may be carbon dioxide.

The first nozzle 462, the second nozzle 464, and the third nozzle 466 may be supported by different arms 461, and the arms 461 may be independently moved. Optionally, the first nozzle 462, the second nozzle 464, and the third nozzle 466 may be mounted to the same arm and moved at the same time.

The lifting unit 480 moves the cup 420 in the vertical direction. By the vertical movement of the cup 420, a relative height between the cup 420 and the substrate W is changed. Accordingly, since the recovery containers 422, 424, and 426 for recovering the pre-treatment liquid are changed according to the type of the liquid supplied to the substrate W, the liquids may be separated and collected. Unlike the description, the cup 420 may be fixedly installed, and the lifting unit 480 may move the support unit 440 in the vertical direction.

Figure 3:
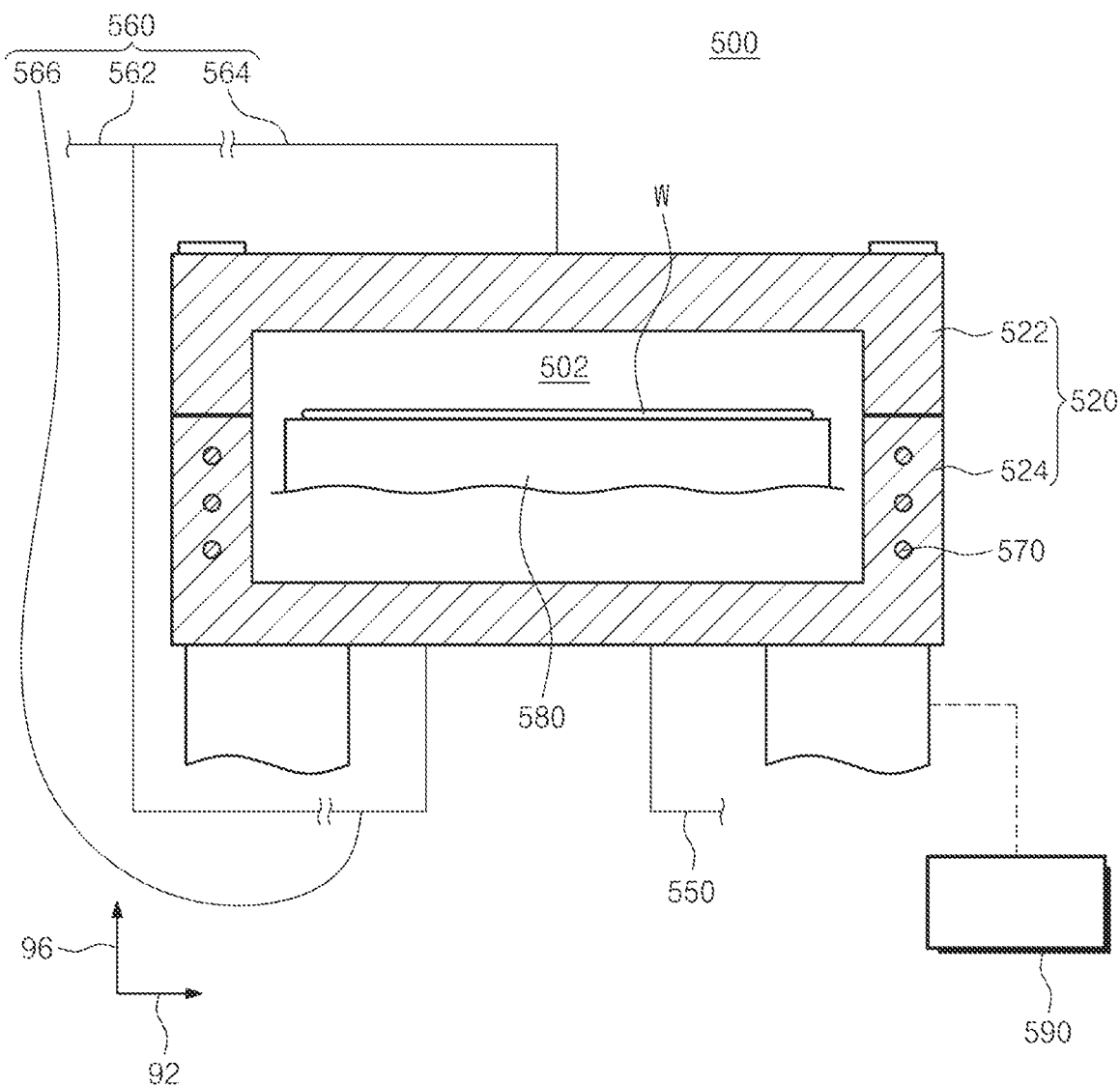
FIG. 3 is a diagram schematically illustrating an exemplary embodiment of a supercritical chamber of FIG. 1.

FIG. 3 is a diagram schematically illustrating an exemplary embodiment of the supercritical device 500 of FIG. 1.

According to the exemplary embodiment, the supercritical device 500 removes the liquid on the substrate W by using the supercritical fluid. According to the exemplary embodiment, the liquid on the substrate W may be IPA. The supercritical device 500 removes the IPA from the substrate W by supplying the supercritical fluid onto the substrate and dissolving the IPA on the substrate W in the supercritical fluid. In one example, the supercritical fluid is carbon dioxide in a supercritical state.

The supercritical device 500 includes a supercritical chamber 520, a fluid supply unit 560, a support unit 580, a heating means (not illustrated), and an exhaust line 550 therein.

The supercritical chamber 520 provides a treatment space 502 in which supercritical processing is performed. The supercritical chamber 520 includes an upper housing 522 and a lower housing 524, and the upper housing 522 and the lower housing 524 are combined with each other to provide the treatment space 502 described above. The upper housing 522 is provided on top of the lower housing 524.

In one example, the position of the upper housing 522 is fixed, and the lower housing 524 may be raised and lowered by a driving member 590, such as a cylinder. Optionally, the position of the lower housing 524 is fixed, and the upper housing may be raised and lowered by a driving member, such as a cylinder. When the lower housing 524 is spaced apart from the upper housing 522, the treatment space 502 is opened, and the substrate W is loaded or unloaded at this time.

During the process, the lower housing 524 is in close contact with the upper housing 522 so that the treatment space 502 is sealed from the outside.

The support unit 580 supports the substrate W in the treatment space 502 of the supercritical chamber 520. The substrate W loaded into the treatment space 502 of the supercritical chamber 520 is placed on the support unit 580. According to one example, the substrate W is supported by the support unit 580 so that a pattern surface heads upward.

The fluid supply unit 560 supplies a supercritical fluid for treating the substrate to the treatment space 502 of the supercritical chamber 520. According to an example, the fluid supply unit 560 includes a main supply line 562, an upper supply line 564, and a lower supply line 566. The upper supply line 564 and the lower supply line 566 are branched from the main supply line 562. The upper supply line 564 may be coupled to the center of the upper housing 522. In one example, the lower supply line 566 may be coupled to the lower housing 524. In addition, an exhaust line is coupled to the lower housing 524. The fluid in the treatment space 502 of the supercritical chamber 520 is exhausted to the outside of the supercritical chamber 520 through the exhaust line.

The heating means (not illustrated) heats the fluid supplied into the supercritical chamber 520. In one example, the heating means (not illustrated) is provided as a heater installed in at least one of the main supply line 562, the upper supply line 564, and the lower supply line 566. Alternatively, the heating means (not illustrated) may be a heater installed on the inner wall of the supercritical chamber 520.

The heating means (not illustrated) heats the fluid supplied to the treatment space 502 to make the fluid be a supercritical fluid state. In one example, the heating means (not illustrated) is provided as a heater installed in the upper supply line 564 and the lower supply line 566 to heat the fluid outside the treatment space 502 to a first temperature and supplies the heated fluid to the treatment space 502. In one example, the first temperature is provided with a temperature lower a critical point of the fluid. The fluid of the first temperature pressurizes the treatment space 502 for a predetermined period of time, and then is converted to a supercritical state.

Figure 4:
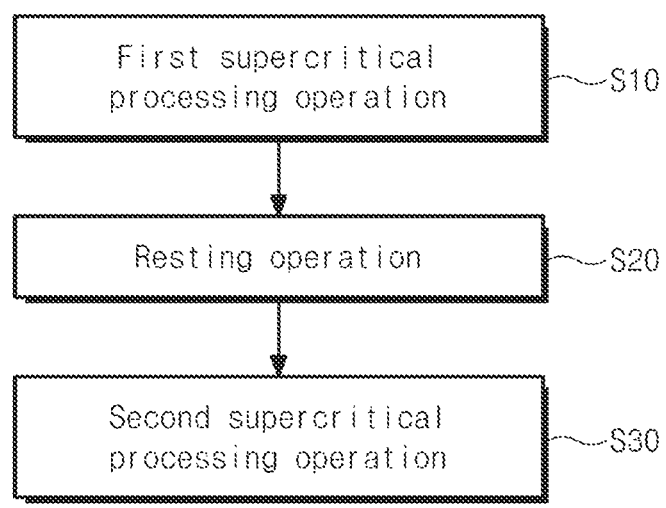
FIG. 4 is a diagram schematically illustrating an example of a first fluid supply unit and a second fluid supply unit for supplying a supercritical fluid according to an exemplary embodiment of the present invention.

Hereinafter, a substrate treating method of the present invention will be described with reference to FIGS. 4 to 8. FIG. 4 is a flowchart illustrating a substrate treating method according to the exemplary embodiment of the present invention. The controller controls the substrate treating apparatus to perform the substrate treating method of the present invention. In one example, the fluid supplied to the treatment space 502 is carbon dioxide.

Figure 5:
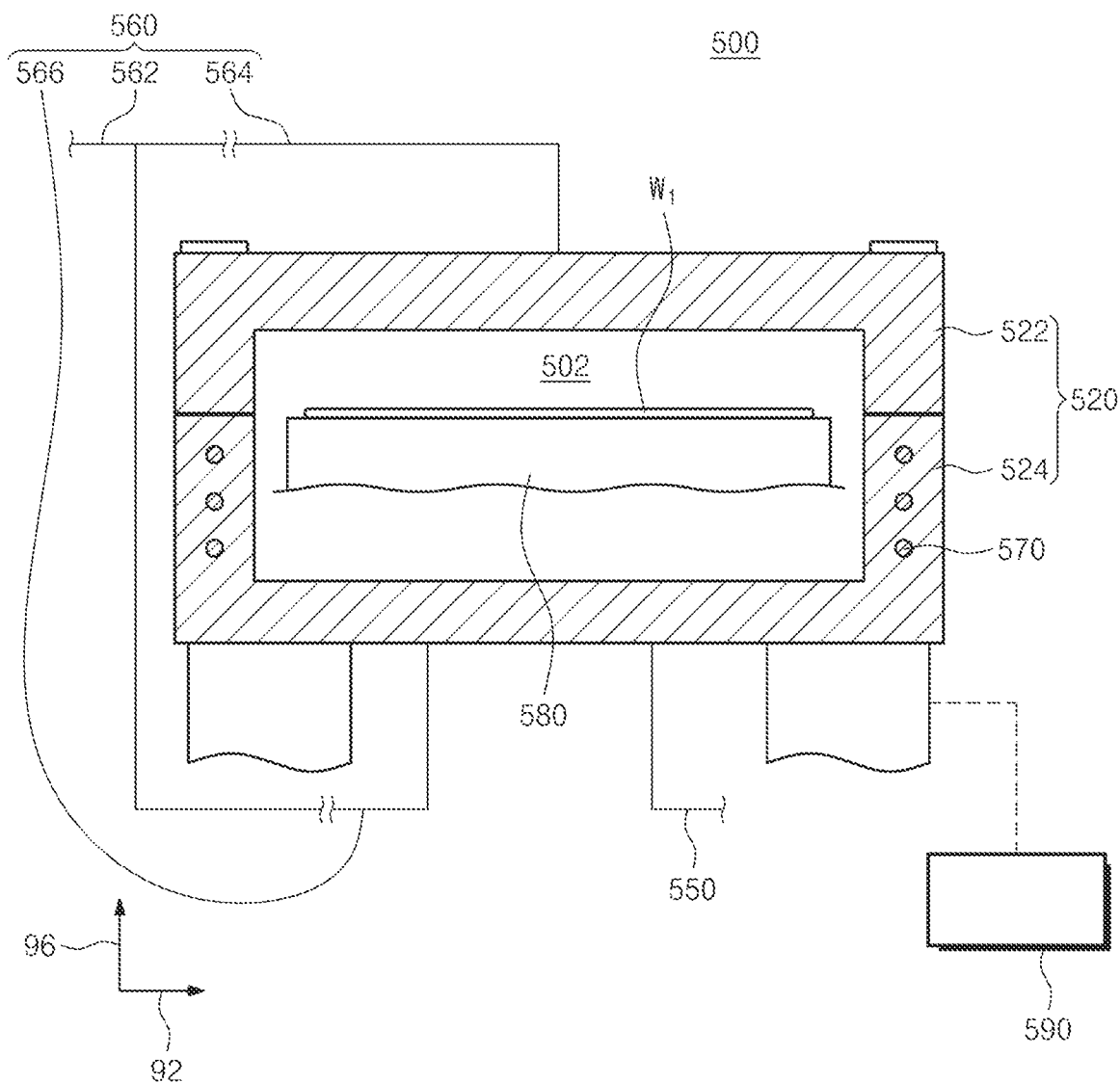
FIG. 5 is a flowchart illustrating a substrate treating method according to an exemplary embodiment of the present invention.
Figure 6:
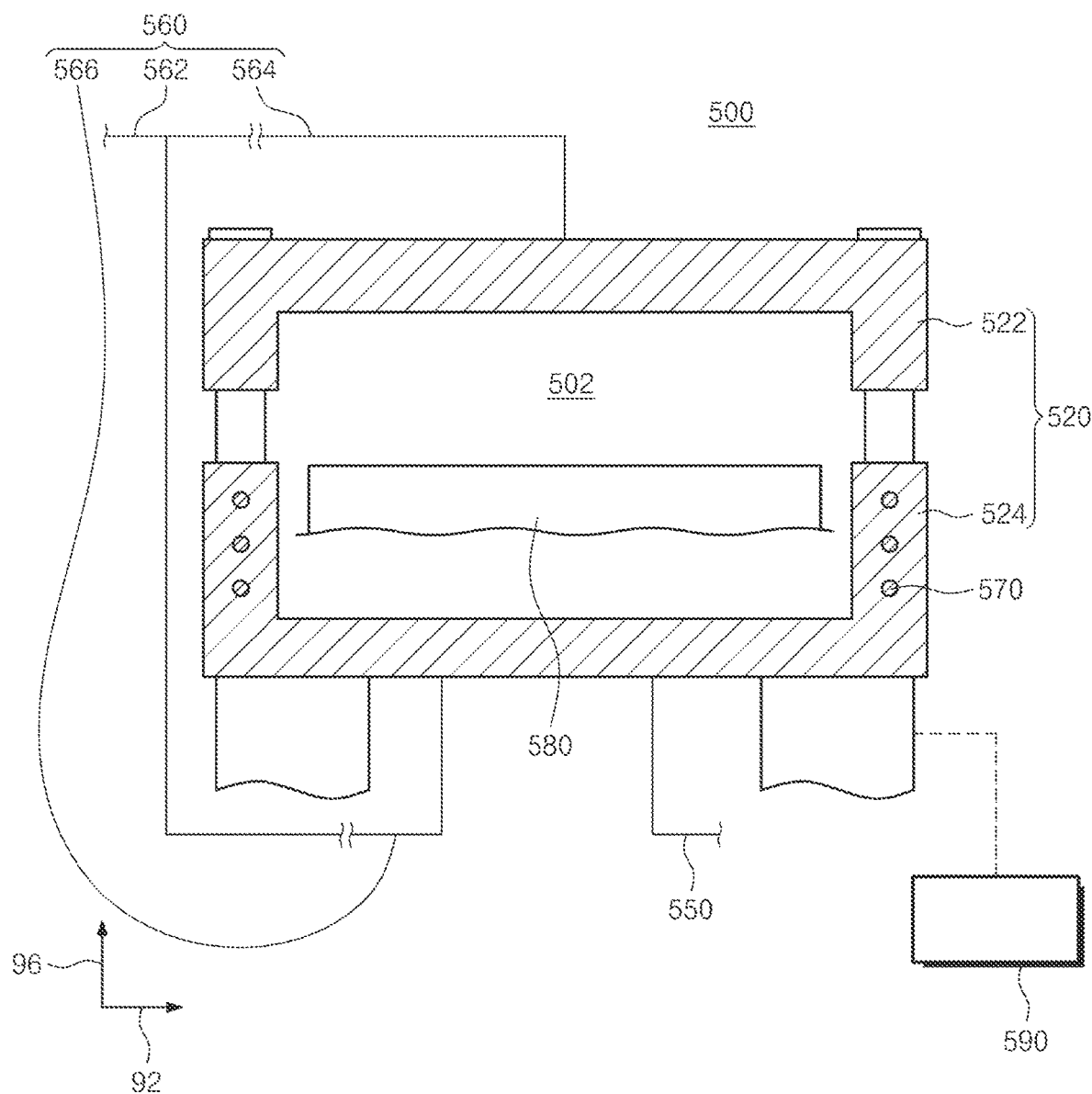
FIG. 6 is a diagram illustrating a state in which the first fluid supply unit of FIG. 4 supplies a supercritical fluid in which an organic solvent is dissolved to a process chamber in a pressurizing operation.
Figure 7:
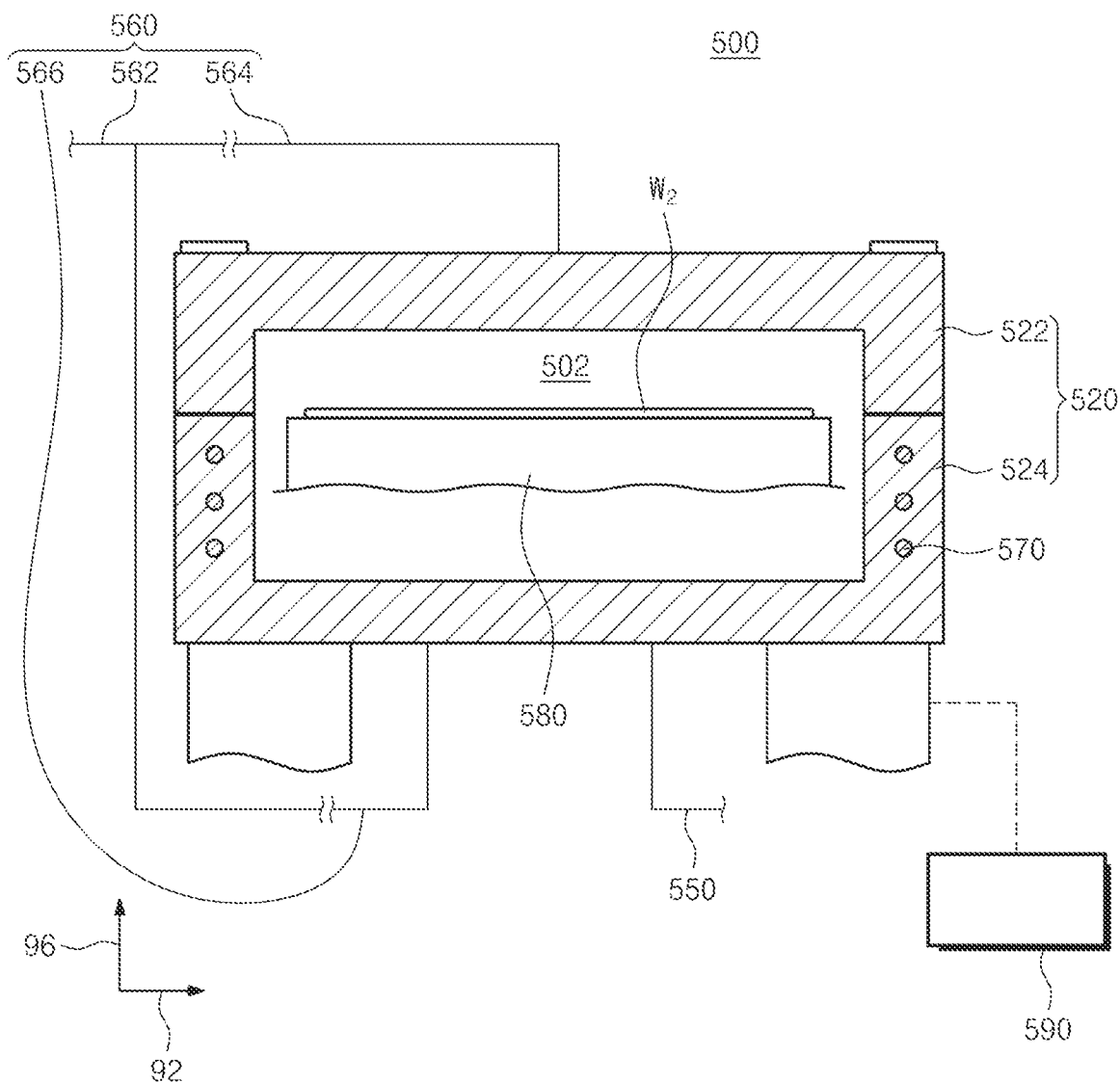
FIG. 7 is a view illustrating a state in which the second fluid supply unit of FIG. 4 supplies a supercritical fluid in which an organic solvent is not dissolved to the process chamber in a treating operation.

Referring to FIG. 4, the substrate treating method of the present invention includes a first supercritical processing operation S10, a resting operation S20, and a second supercritical processing operation S30. In the first supercritical processing operation S10, as illustrated in FIG. 5, a first substrate W1 is loaded into the supercritical chamber 520 and the supercritical processing is performed on the first substrate W1 in the supercritical chamber 520. Thereafter, as illustrated in FIG. 6, in the resting operation S20, after the first substrate W1 is unloaded from the supercritical chamber 520, the supercritical chamber 520 is opened and the supercritical chamber 520 is maintained in an empty state for a first time until the temperature in the supercritical chamber 520 reaches a preset temperature. When the resting operation S20 is completed, as illustrated in FIG. 7, in the second supercritical processing operation S30, a second substrate W2 is loaded into the supercritical chamber 520 and a supercritical processing is performed on the second substrate W2 in the supercritical chamber 520. For convenience of explanation, only the first supercritical processing operation S10 and the second supercritical processing operation S30 are specified, but a number of substrates corresponding to two or more may be sequentially supercritically processed in the supercritical chamber 520, and the rest operation S20 may be included between the supercritical processing operations.

In one example, each supercritical processing operation includes a pressurizing operation and a treating operation. In the pressurizing operation, carbon dioxide at a first temperature is supplied to the treatment space 502 to pressurize the treatment space 502. The pressurization is performed until the inside of the treatment space 502 reaches a critical pressure or higher at which carbon dioxide becomes a supercritical fluid. Thereafter, in the treating operation, the substrate is treated with carbon dioxide in the supercritical state.

Figure 8:
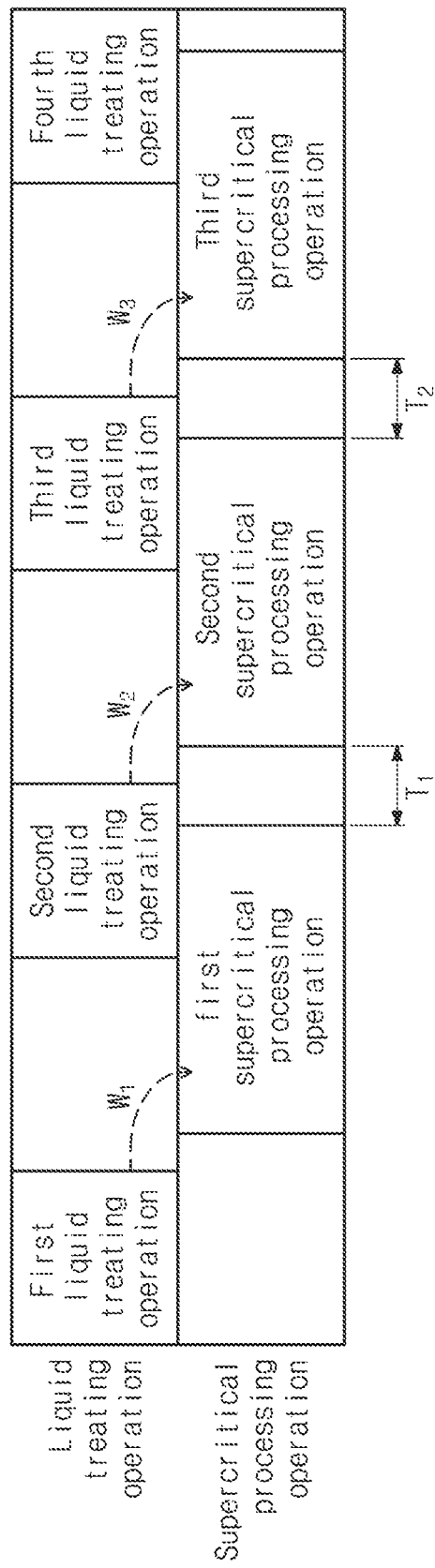
FIG. 8 is a diagram illustrating a state in which an exhaust unit of FIG. 4 exhausts the process chamber in an exhaust operation.

FIG. 8 is a scheduling table illustrating time points $T_1$ and $T_2$ at which the resting operation S20 ($T_1$, $T_2$) is performed according to the exemplary embodiment of the present invention. In one example, several substrates are sequentially supercritically processed in the supercritical chamber 520, and each substrate is supercritically processed under the same process conditions. However, as the substrate is treated by repeatedly supplying high-temperature carbon dioxide into the treatment space 502, the treatment space 502 is overheated more than necessary. In order to prevent the overheating, in the present invention, the resting operation S20 is provided between the first supercritical processing operation S10 and the second supercritical processing operation S30. In the resting operation S20, the supercritical chamber 520 heated in the first supercritical processing operation S10 is naturally cooled to prevent the supercritical chamber 520 from being overheated.

In one example, the resting operation S20 is performed for a first preset time. In each supercritical processing operation and the resting operation S20, the resting operation S20 is performed for a predetermined time without separately measuring the temperature inside or outside the supercritical chamber 520. For example, when the substrate is unloaded from the treatment space 502 by opening the supercritical chamber 520 after the first supercritical processing operation S10 and the supercritical chamber 520 is maintained in an open state, data relating to the relationship between time and the temperature drop inside the supercritical chamber 520 is stored in advance. Further, based on the data, it is set for how long to perform the resting operation S20. In one example, the first time for performing the resting operation S20 may be set based on an initial set temperature for treating the second substrate W2 in the second supercritical processing operation S30. For example, the initial set temperature is the initial temperature in the chamber required for the supercritical processing of each substrate. In one example, the initial set temperature may be provided equal to or lower than the temperature of the fluid supplied to the treatment space 502 in the pressurizing operation. That is, the resting operation S20 is performed for a time during which the internal temperature of the supercritical chamber 520 becomes the first temperature or a lower temperature than the first temperature, and in the pressurizing operation, carbon dioxide at the first temperature may be supplied to the treatment space 502. As the internal temperature of the supercritical chamber 520 is lowered to a temperature for treating the succeeding substrate or less, a problem due to overheating of the treatment space 502 may be prevented when treating the succeeding substrate. In addition, since each substrate may be treated at the same process temperature, process results in the same condition may be obtained.

However, even if the time for inputting the substrate into the supercritical chamber 520 is adjusted when performing the supercritical processing, if the substrate to be transferred to the supercritical chamber 520 does not reach the supercritical chamber 520 in time, after the resting operation S20 is finished, the succeeding substrate cannot be supercritically processed at an appropriate time. In this case, the temperature of the treatment space 502 may be too low to affect the process. To prevent this, the present invention includes a temperature correcting operation.

In one example, before the supercritical processing of the substrate, the substrate is liquid-treated in the liquid treating chamber 400 and the transfer means 300 transfers the substrate from the liquid treating chamber 400 to the supercritical chamber 520. However, there may be a case in which the substrate cannot be transferred to the supercritical chamber 520 due to a problem in the liquid treating chamber 400 or the transfer means 300. When the transfer of the substrate is delayed due to the elapse of a preset transfer time, the temperature of the treatment space 502 may be excessively lowered, so that a temperature correcting operation is performed.

Figure 9:
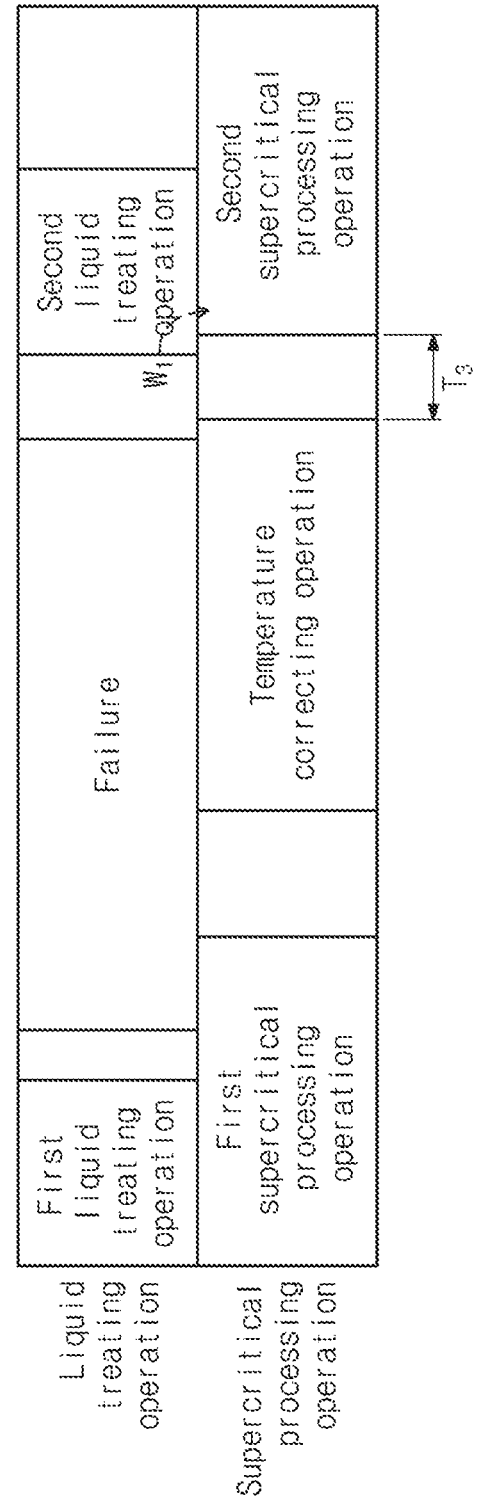
FIG. 9 illustrates a state in which a temperature correcting operation is performed according to an exemplary embodiment of the present invention.

FIG. 9 illustrates a state in which a temperature correcting operation is performed according to an exemplary embodiment of the present invention. After the first supercritical processing operation S10 is performed, the resting operation S20 is performed for a preset time. When the second substrate W2 is not put into the supercritical chamber 520 within the preset time after the resting operation S20 is performed, the temperature correcting operation is performed. In one example, the temperature correcting operation may be performed for a time for the temperature inside the supercritical chamber 520 to become the initial set temperature. For example, the initial set temperature is the initial temperature in the chamber required for supercritical processing of each substrate.

In one example, the temperature correcting operation may be performed by supplying the fluid of the first temperature into the supercritical chamber 520. In the temperature correcting operation, as in the pressurizing operation, carbon dioxide at the first temperature may be supplied to the treatment space 502 through the fluid supply unit. In the exemplary embodiment, the inside of the supercritical chamber 520 may be cleaned with a high-temperature fluid in the temperature correcting operation. In the temperature correcting operation, as in the pressurizing operation, as carbon dioxide of the first temperature is supplied to the treatment space 502, there is an advantage in that the temperature of the treatment space 502 is adjusted to a suitable temperature for treating the succeeding substrate.

In one example, the temperature correcting operation may be performed without measuring the temperature inside or outside the supercritical chamber 520, like the resting operation S20. For example, when the fluid of the first temperature is supplied into the treatment space 502, data relating to a relationship between time and a temperature increase in the supercritical chamber 520 are stored in advance. Then, based on the data, it is set for how long to perform the temperature correcting operation.

In the exemplary embodiment, after the temperature correcting operation, the resting operation S20 may be performed. For example, when the substrate is not ready to be loaded into the supercritical chamber 520 even while the temperature correcting operation is being performed, the resting operation S20 may be performed to prevent the treatment space 502 from being overheated.

According to the exemplary embodiment of the present invention, it is possible to prevent the temperature inside the supercritical chamber 520 from being overheated or excessively cooled.

In addition, according to the exemplary embodiment of the present invention, when several substrates are successively treated in the supercritical chamber 520, each substrate may be treated at the same temperature.

In the above-described example, it has been described that each operation is performed without a means for measuring the temperature inside or outside the supercritical chamber 520. However, unlike this, the temperature inside or outside the supercritical chamber 520 may be measured, and each operation may be performed based on a result of the measurement.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating method, comprising:
    loading a first substrate into a supercritical chamber and supercritically processing the first substrate in the supercritical chamber;
    maintaining the supercritical chamber in an empty state for a first time until a temperature in the supercritical chamber becomes a preset temperature by opening the supercritical chamber after the first substrate is unloaded from the supercritical chamber;
    liquid-treating a second substrate in a liquid treating chamber;
    transferring the second substrate from the liquid treating chamber to the supercritical chamber, wherein when the transferring is delayed from a preset time, correcting a temperature in the supercritical chamber is performed prior to transferring the second substrate into the supercritical chamber, wherein the temperature correcting includes increasing the temperature in the supercritical chamber; and
    supercritically processing the second substrate in the supercritical chamber.

2. The substrate treating method of claim 1, wherein the first time is set based on an initial set temperature for supercritically processing the second substrate.

3. The substrate treating method of claim 2, wherein supercritically processing the second substrate includes:
    pressurizing the supercritical chamber by supplying a fluid of a first temperature into the supercritical chamber to pressurize the fluid; and
    treating the second substrate with the fluid,
    wherein the initial set temperature is equal to or lower than the first temperature.

4. The substrate treating method of claim 1, wherein the temperature correcting is performed for a time for the temperature in the supercritical chamber to become an initial set temperature for supercritically processing the second substrate.

5. The substrate treating method of claim 1, wherein the temperature correcting is performed by supplying a fluid of a first temperature to the supercritical chamber.

6. The substrate treating method of claim 1, wherein after the temperature correcting, the supercritical chamber is maintained in an empty state for a second time until the temperature in the supercritical chamber becomes the preset temperature by opening the supercritical chamber.

* * * * *